United States Patent
Arima

(10) Patent No.: US 9,892,667 B2
(45) Date of Patent: Feb. 13, 2018

(54) DISPLAY DEVICE AND METHOD FOR DRIVING SAME

(71) Applicant: JOLED INC., Tokyo (JP)

(72) Inventor: Takayuki Arima, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/118,256

(22) PCT Filed: Dec. 24, 2014

(86) PCT No.: PCT/JP2014/006423
§ 371 (c)(1),
(2) Date: Aug. 11, 2016

(87) PCT Pub. No.: WO2015/125199
PCT Pub. Date: Aug. 27, 2015

(65) Prior Publication Data
US 2017/0186349 A1    Jun. 29, 2017

(30) Foreign Application Priority Data
Feb. 19, 2014   (JP) ................................ 2014-029728

(51) Int. Cl.
*G09G 3/00*     (2006.01)
*G09G 3/20*     (2006.01)
(Continued)

(52) U.S. Cl.
CPC ........... *G09G 3/006* (2013.01); *G09G 3/2085* (2013.01); *G09G 3/325* (2013.01); *G09G 3/3233* (2013.01);
(Continued)

(58) Field of Classification Search
None
See application file for complete search history.

(56) References Cited

U.S. PATENT DOCUMENTS 9,443,608 B2    9/2016 Matsui et al.

FOREIGN PATENT DOCUMENTS

| EP | 2012298 | 1/2009 |
|---|---|---|
| JP | 7-152014 | 6/1995 |

(Continued)

OTHER PUBLICATIONS

English translation of Japanese patent publication JP 2013-160999A.*

(Continued)

*Primary Examiner* — Nicholas Lee
(74) *Attorney, Agent, or Firm* — Greenblum & Bernstein, P.L.C.

(57) ABSTRACT

A display device includes: a display panel substrate which includes pixel circuits disposed in rows and columns; COF substrates connected to the display panel substrate; gate driver ICs for display driving, which are mounted on the display panel substrate or on the COF substrates, and each of which includes a shift register; printed circuit boards which are connected to the COF substrates, and each of which includes one or more lines which cascade the gate driver ICs; and a control unit configured to supply a predetermined signal to a cascade input terminal of a gate driver IC located most upstream of the cascade, and monitor a signal from a cascade output terminal of at least one gate driver IC located downstream of the gate driver IC located most upstream.

6 Claims, 8 Drawing Sheets

(51) Int. Cl.
  *G09G 3/3233* (2016.01)
  *G09G 3/325* (2016.01)
  *G09G 3/3266* (2016.01)
  *G11C 19/00* (2006.01)
  *H01L 27/32* (2006.01)

(52) U.S. Cl.
  CPC ........... *G09G 3/3266* (2013.01); *G11C 19/00* (2013.01); *H01L 27/3244* (2013.01); *G09G 2300/043* (2013.01); *G09G 2300/0426* (2013.01); *G09G 2300/0819* (2013.01); *G09G 2300/0842* (2013.01); *G09G 2300/0861* (2013.01); *G09G 2310/0286* (2013.01); *G09G 2320/0646* (2013.01); *G09G 2330/04* (2013.01); *G09G 2330/08* (2013.01); *G09G 2330/10* (2013.01); *G09G 2330/12* (2013.01); *H01L 27/3241* (2013.01)

(56) References Cited

FOREIGN PATENT DOCUMENTS

| | | |
|---|---|---|
| JP | 2006-227238 | 8/2006 |
| JP | 2008-185978 | 8/2008 |
| JP | 2009-003155 | 1/2009 |
| JP | 2009-015281 | 1/2009 |
| JP | 2013-160999 | 8/2013 |

OTHER PUBLICATIONS

International Search Report (ISR) from International Searching Authority (Japan Patent Office) in International Pat. Appl. No. PCT/JP2014/006423, dated Mar. 24, 2015.

\* cited by examiner

DISPLAY DEVICE AND METHOD FOR DRIVING SAME

TECHNICAL FIELD

The present disclosure relates to a display device, and in particular to a display device which includes a light emitting element that emits light according to a current, and a method for driving the same.

BACKGROUND ART

In recent years, for flat panel display devices such as liquid crystal display devices and organic electroluminescent (EL) display devices, thermo compression bonding performed using anisotropic conductive films (ACFs) has been employed to connect a display panel substrate and a chip on film (COF) substrate on which a driver integrated circuit (IC) is mounted and to connect the COF substrate and a printed circuit board. Here, an ACF is a material which is a mixture of conductive particles and an adhesive formed into tape shape. By ACF boding, an ACF is placed between terminal portions of different substrates, and thereafter subjected to thermo compression. Consequently, terminals of the substrates in the vertical direction are electrically connected via conductive particles, and simultaneously terminals of the respective substrates are insulated from one another, and then the substrates are bonded by the adhesive being cured. Such ACF bonding can be used as a substitute for connector connection, and achieves connection with a greater number of pins, with a lower height, and at a finer pitch than connector connection.

If thermo compression bonding is applied to edge portions of a COF substrate so as to connect a printed circuit board and the COF substrate by ACF bonding and to connect the COF substrate and a display panel substrate by ACF bonding, it is difficult to obtain great strength of connection. In addition, the COF substrate is flexible, but nevertheless the COF substrate has rigidity to a certain extent. Accordingly, if, for example, the COF substrate is repeatedly deformed by heat expansion/contraction of the connected substrates and other causes, the deformation stress may cause detachment of an edge portion of the COF substrate to which thermo compression boding has been applied.

In view of this, Patent Literature (PTL) 1 discloses a technique of preventing detachment of an edge portion of a film of a COF substrate from a printed circuit board or from a liquid crystal display panel. Specifically, providing an opening in the COF substrate decreases the rigidity of the film of the COF substrate and increases flexibility of the film so that the film receives less deformation stress, thus preventing the film from becoming detached.

CITATION LIST

Patent Literature

[PTL 1] Japanese Unexamined Patent Application Publication No. 2008-185978

SUMMARY OF INVENTION

Technical Problem

However, in particular, a large display panel is greatly deformed by heat expansion/contraction, which may cause detachment of a COF substrate from a printed circuit board.

If the COF substrate has become detached from the printed circuit board, a pixel display control signal is not appropriately supplied, which may result in problems such as abnormal display of, abnormal heat generation by, and damage to the display panel.

The present disclosure provides a display device which detects detachment of a COF substrate from a printed circuit board, and a method for driving the display device.

Solution to Problem

In order to address the above problems, the display device according to the present disclosure includes: a display panel substrate which includes a plurality of pixel circuits disposed in rows and columns; a plurality of film substrates connected to the display panel substrate; a plurality of driver integrated circuits (ICs) for display driving, which are mounted on the display panel substrate or on the plurality of film substrates, and each of which includes a shift register; a printed circuit board connected to the plurality of film substrates, and including one or more lines which cascade the plurality of driver ICs; and a control unit configured to supply a predetermined signal to a cascade input terminal of a driver IC located most upstream among the plurality of driver ICs cascaded, and monitor a signal from a cascade output terminal of at least one driver IC located downstream of the driver IC located most upstream.

This configuration allows detecting detachment of a film substrate (specifically, COF substrate) from a printed circuit board.

Advantageous Effects of Invention

The display device according to the present disclosure detects detachment of a COF substrate from a printed circuit board.

DESCRIPTION OF EMBODIMENTS

Embodiment

The following describes embodiments in detail with reference to the drawings as appropriate. However, an unnecessarily detailed description may be omitted. For example, a detailed description of a matter already known well and a redundant description of substantially the same configuration may be omitted. This is intended to avoid making the following description unnecessarily redundant and to facilitate understanding of a person skilled in the art. Furthermore, the drawings do not necessarily strictly illustrate the sizes and the proportions, for instance.

Note that the inventors provide the accompanying drawings and the following description in order that a person skilled in the art sufficiently understands the present disclosure, and thus do not intend to limit the subject matters of the claims by these. The embodiments described below each show a preferable, particular example. The numerical values, shapes, materials, elements, the arrangement and connection of the elements, steps, the processing order of the steps, and the like described in the following embodiments are mere examples, and thus are not intended to limit the present disclosure. Therefore, an element which is included in the elements in the embodiments below, but is not described in independent claims is not necessarily needed in order to achieve the object of the present disclosure, yet such an element will be described as being included in a more preferred embodiment.

[1. Configuration of Display Device]

Figure 1:
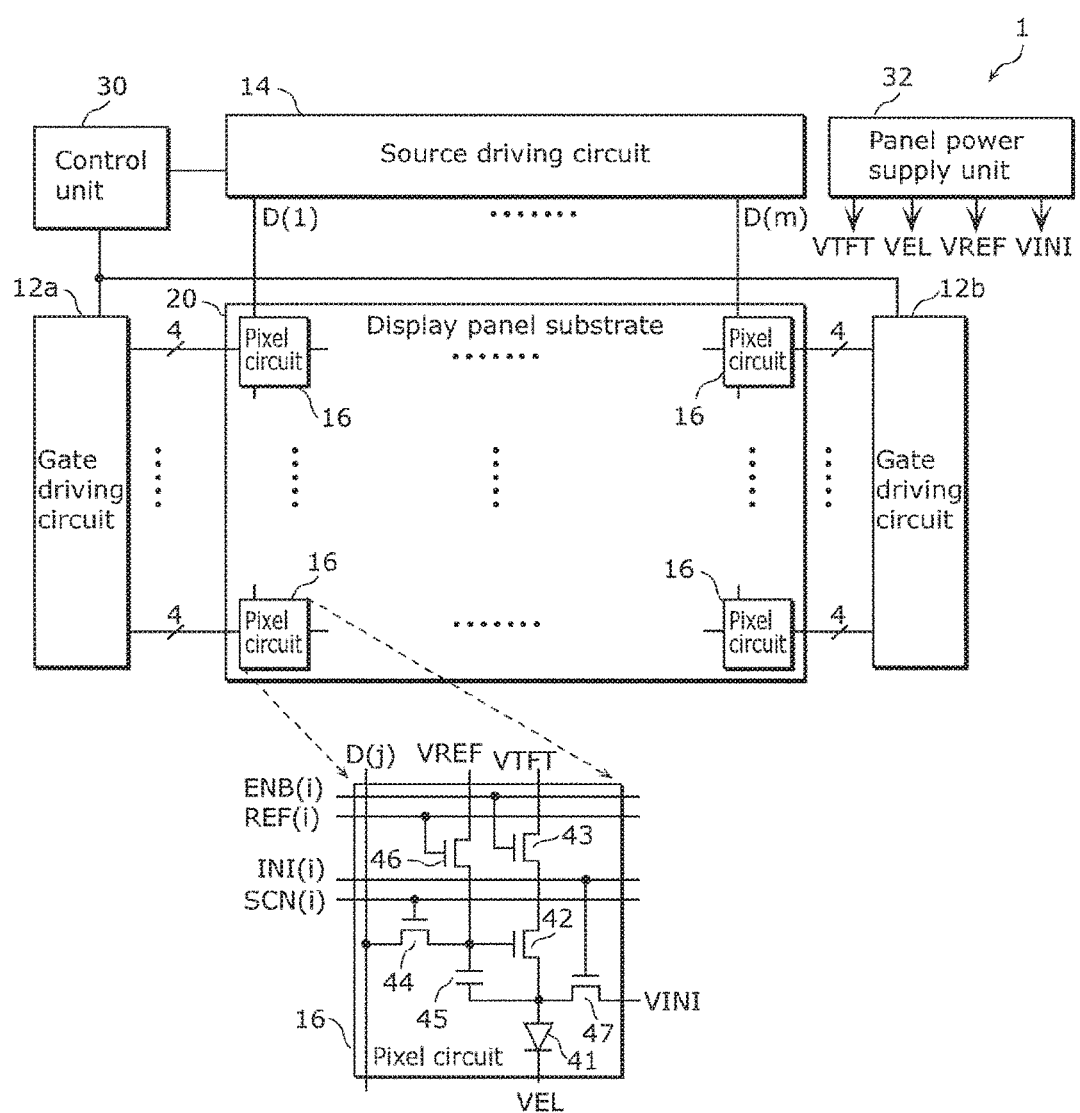
FIG. 1 is a block diagram illustrating an example of a configuration of a display device and pixel circuits according to Embodiment 1.

FIG. 1 is a block diagram illustrating an example of a configuration of a display device and pixel circuits according to Embodiment 1. A display device 1 illustrated in FIG. 1 includes a display panel substrate 20, gate driving circuits 12a and 12b, a source driving circuit 14, a control unit 30, and a panel power supply unit 32.

[1-1. Schematic Configuration of Display Panel Substrate]

First, an example of a circuit configuration of the display panel substrate 20 is described.

The display panel substrate 20 includes pixel circuits 16 disposed in rows and columns. The pixel circuits 16 are formed on the display panel substrate 20 by semiconductor processing. The material of the display panel substrate 20 is glass or resin such as acrylic resin.

The pixel circuits 16 are disposed in n rows and m columns. The values of n and m differ depending on the size and resolution of a display portion. For example, at a resolution referred to as high definition (HD), if the pixel circuits 16 corresponding to three primary colors, namely, red, green, and blue (RGB) are adjacent in the rows, n rows are at least 1080 rows and m columns are at least 1920×3 columns.

The pixel circuits 16 each form a pixel which emits one of the RGB primary colors. The pixel circuits 16 each include a light emitting element 41, a drive transistor 42, an enabling switch 43, a scan switch 44, a capacitor 45, a reference (REF) switch 46, and an initialization (INI) switch 47.

Pixel circuits 16 belonging to the i-th row (i is an integer of 1 to n) are connected to an ENB(i) signal line, a REF(i) signal line, an INI(i) signal line, and a SCN(i) signal line. The gate driving circuits 12a and 12b each supply the signal lines with an enable signal, a REF control signal, an INI control signal, and a scan signal.

Furthermore, pixel circuits 16 belonging to the j-th column (j is an integer of 1 to m) are connected to a D(j) signal line. The source driving circuit 14 supplies the D(j) signal line with a voltage according to the brightness at which the pixel circuits 16 are to emit light.

The ENB(i) signal line passes an enable signal for controlling whether the pixel circuits 16 belonging to the i-th row are allowed to emit light. An enable signal controls on and off of the enabling switch 43 in each of the corresponding pixel circuits 16.

The SCN(i) signal line passes a scan signal (also referred to as a write signal) for controlling writing pixel data to the pixel circuits 16 belonging to the i-th row. A scan signal controls on and off of the scan switch 44 in each of the corresponding pixel circuits 16.

The REF(i) signal line passes a REF control signal for controlling the supply of a reference voltage to the pixel circuits 16 belonging to the i-th row. The REF control signal controls on and off of the REF switch 46 in each of the corresponding pixel circuits 16.

The INI(i) signal line passes an INI control signal for controlling the supply of an initializing voltage to the pixel circuits 16 belonging to the i-th row. The INI control signal controls on and off of the INI switch 47 in each of the corresponding pixel circuits 16.

The D(j) signal line is a data line for passing, as pixel data, a voltage representing pixel brightness to the pixel circuits 16 belonging to the j-th column. The pixel data is provided through the D(j) signal line to the capacitor 45 via the scan switch 44, by the control of the scan signal.

In the following, (i) and (j) in the names of the various signal lines are omitted unless the position of a pixel circuit 16 is particularly indicated.

The light emitting element 41 in each pixel circuit 16 in FIG. 1 is an organic EL element and is an example of a light emitting element also referred to as an organic light emitting diode (OLED), and emits light at a brightness according to the magnitude of a current flowing through the light emitting element 41. The anode of the light emitting element 41 is connected to the source of the drive transistor 42, and the cathode of the light emitting element 41 is connected to a power line VEL.

The drive transistor 42 is a driver which supplies a current to the light emitting element 41. The gate of the drive transistor 42 is connected to one electrode of the capacitor 45, and the source of the drive transistor 42 is connected to the other electrode of the capacitor 45 and to the anode of the light emitting element 41. This connection allows a voltage stored in the capacitor 45, that is, a voltage representing pixel brightness to be applied between the gate and the source of the drive transistor 42. In this manner, the drive transistor 42 supplies the light emitting element 41 with a current having an amount according to the voltage stored in the capacitor 45.

The enabling switch 43 is a switch transistor which allows and prevents the supply of a current from the drive transistor 42 to the light emitting element 41. The enabling switch 43 is switched on and off in accordance with an enable signal. An enable signal enables and disables, row-by-row, light emission of the pixel circuits 16 in rows and columns. Thus, when a high-level enable signal is supplied to the ENB signal line, the enabling switch 43 is on, and supplies a voltage VTFT to the drive transistor 42. When a low-level enable signal is supplied to the ENB signal line, the enabling switch 43 is off, and interrupts the supply of the voltage VTFT to the drive transistor 42.

The scan switch 44 is a switch transistor for writing, as pixel data, a voltage representing pixel brightness to the capacitor 45. A scan signal is a write signal for selecting, row-by-row, the pixel circuits 16 in rows and columns, and writing a voltage representing brightness to pixel circuits 16 belonging to the selected row. In other words, when a high-level scan signal is supplied to the SCN signal line, the scan switch 44 is on and writes, to the capacitor 45, the voltage passed through the data line as pixel data. When a low-level scan signal is supplied to the SCN signal line, the scan switch 44 is off, and electrically interrupts the connection between the SCN signal line and the capacitor 45.

The capacitor 45 stores, as pixel data, a voltage representing pixel brightness in between the gate and the source of the drive transistor 42.

The REF switch 46 is a switch transistor for applying the reference voltage VREF to the one electrode of the capacitor 45. The INI switch 47 is a switch transistor for applying an initializing voltage VINI to the other electrode of the capacitor 45. The REF switch 46 and the INI switch 47 are used for threshold compensation operation for storing, in the capacitor 45, a voltage corresponding to the actual threshold voltage of the drive transistor 42 connected to the capacitor 45. More specifically, the threshold compensation operation is to compensate for the threshold shift of the drive transistors in the pixel circuits. Accordingly, first, as an initial voltage for the threshold voltage compensation operation, a maximum threshold voltage (in other words, a voltage considered to have a maximum value when the threshold shift occurs) is set in the capacitor 45 using the reference voltage VREF and the initializing voltage VINI. Furthermore, by passing a current through the drive transistor 42 while the light emitting element 41 is not emitting light, the set initial voltage is decreased down to the voltage corresponding to the actual threshold voltage of the drive transistor 42. Processing up to this is the threshold voltage compensation operation. This causes the capacitor 45 to store a voltage corresponding to the actual threshold voltage of the corresponding drive transistor 42. In this state, pixel data is written to the capacitor 45 so as to add the voltage representing the pixel data.

As described above, the threshold voltage compensation operation is to compensate for variations in threshold due to the threshold shift in the pixel circuits 16, which occurs as a change with the passage of time. Each time pixel data is written to the capacitor 45, the threshold voltage compensation operation is executed immediately before the pixel data is written.

The display panel substrate 20 illustrated in FIG. 1 has the circuit configuration as described above.

[1-2. Configuration of Elements Other than Display Panel Substrate 20]

The following describes a configuration of the surrounding of the display panel substrate 20.

The gate driving circuits 12a and 12b simultaneously drive the same gate signal to the display panel substrate 20. This is to prevent signal degradation due to wiring capacitance of the signal lines of a large display device. For a small display device, a single gate driving circuit 12 may be sufficient.

Here, a gate signal is input to gates of the switch transistors in the pixel circuits 16. Gate signals of four types, namely an enable signal, a REF control signal, an INI control signal, and a scan signal are input to the pixel circuits 16 illustrated in FIG. 1.

The gate driving circuit 12a scans the ENB(1) signal line to the ENB(n) signal line, the SCN(1) signal line to the SCN(n) signal line, the REF(1) signal line to the REF(n) signal line, and the INI(1) signal line to the INI(n) signal line, in accordance with the control by the control unit 30.

In other words, the gate driving circuit 12a outputs an enable signal, a scan signal, a REF control signal, and an INI control signal to the pixel circuits row-by-row.

The gate driving circuit 12b has the same configuration as the gate driving circuit 12a, and simultaneously outputs the same signal as that output by the gate driving circuit 12a.

The source driving circuit 14 supplies the D(1) signal line to the D(m) signal line with voltages representing brightness of pixels belonging to respective columns, based on a video signal input from the control unit 30. The source driving circuit 14 thus supplies, for each of the D(1) signal line to the D(m) signal line, a voltage representing brightness of pixels belonging to the signal line. The supplied voltage is written to the pixel circuits 16 belonging to the selected row, via the scan signal lines. Furthermore, a video signal input from the control unit 30 to the source driving circuit 14 is, for example, input as digital serial data for each of the RGB primary colors. The digital serial data is converted into parallel data on a row-by-row basis and further into analog data on a row-by-row basis in the source driving circuit 14.

Note that only one source driving circuit 14 is illustrated in FIG. 1, yet for a large display device, two source driving circuits may be included vertically, and simultaneously output the same signal.

The control unit 30 controls the entire operation of the display device. In accordance with a vertical synchronizing signal and a horizontal synchronizing signal of a video signal from the outside, the control unit 30 gives an instruction to the gate driving circuits 12a and 12b to start scanning, and supplies the above digital serial data to the source driving circuit 14.

The panel power supply unit 32 supplies various voltages to the pixel circuits 16 of the display panel substrate 20. The various voltages here are VTFT, VEL, VREF, and VINI in the example of the pixel circuit illustrated in FIG. 1. The panel power supply unit 32 allows and stops the supply of such voltages, according to the control of the control unit 30.

The above has described a functional configuration of the display panel substrate 20.

[1-3. Configuration of Various Substrates and Lines and Configuration of Control Unit of Display Device]

Next, a description of a configuration of various substrates and lines of a display device and a configuration of a control unit of the display device is given.

Figure 2:
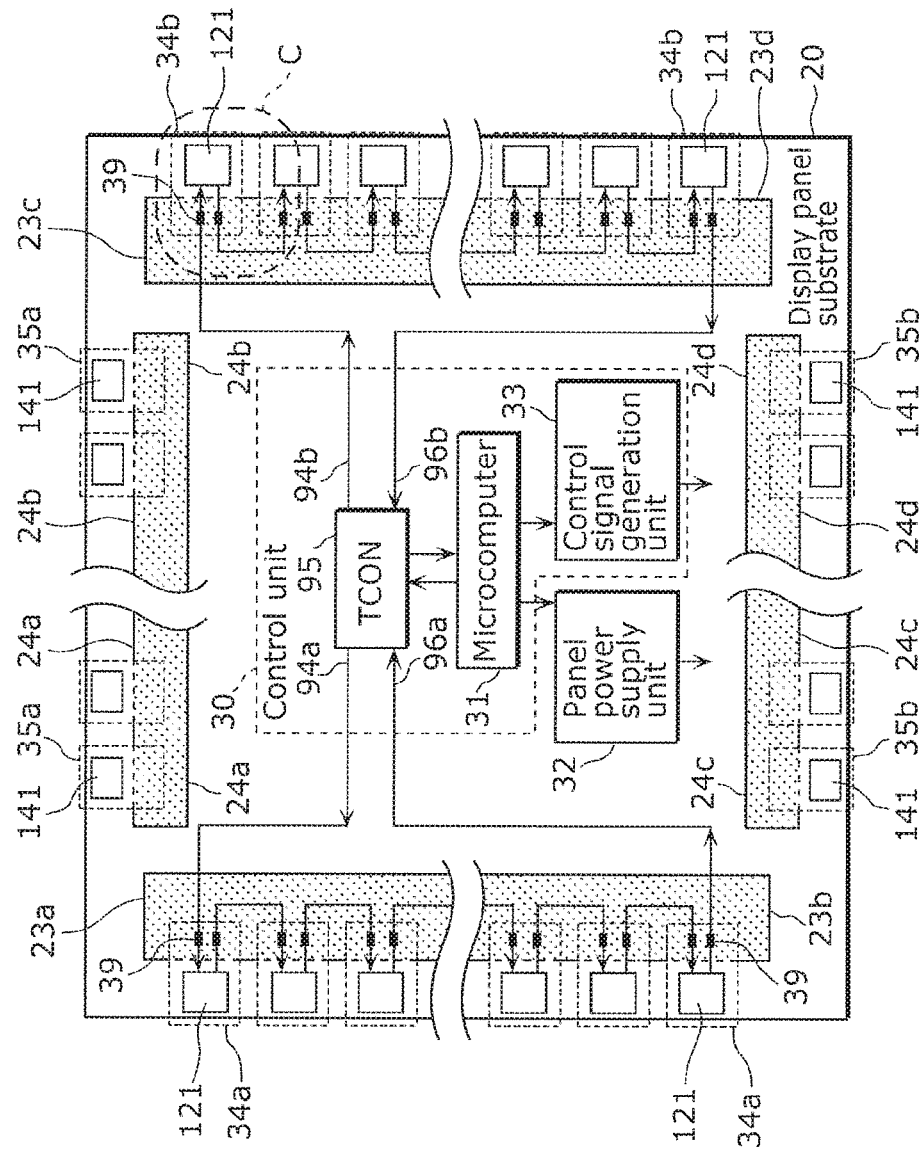
FIG. 2 illustrates an example of a configuration of various substrates and lines of the display device according to Embodiment 1, and an example of a more detailed configuration of a control unit of the display device according to Embodiment 1.
Figure 3A:
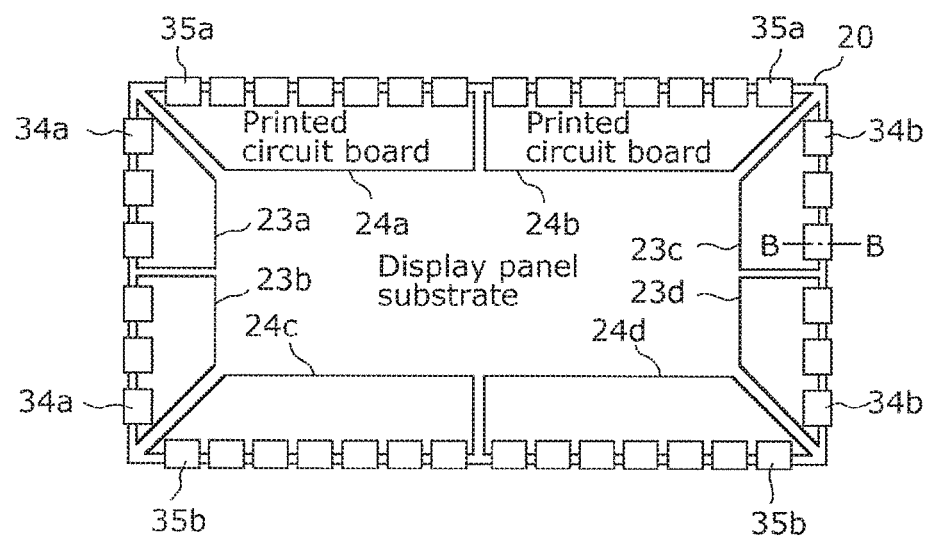
FIG. 3A illustrates an example of mounting the various substrates of the display device according to Embodiment 1.
Figure 4A:
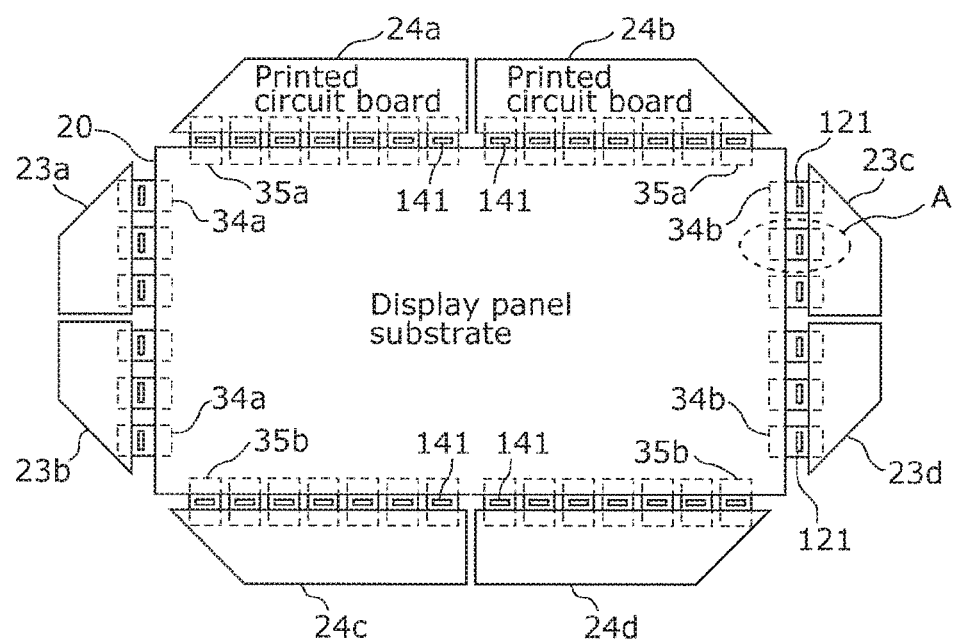
FIG. 4A is a development view of the example of mounting the substrates included in the display device according to Embodiment 1.

FIG. 2 illustrates an example of a configuration of various substrates and lines and an example of a more detailed configuration of the control unit of the display device according to Embodiment 1. FIG. 3A illustrates an example of mounting various substrates of the display device according to Embodiment 1. FIG. 4A is a development view of the example of mounting the various substrates illustrated in FIG. 3A.

Note that FIGS. 2, 3A, and 4A illustrate the back side of the display device 1 which is opposite the display surface of the display device 1 as illustrated in FIG. 1. Note that for the convenience of reference, the lateral arrangement illustrated in FIGS. 2, 3A, and 4A is not the reversed arrangement illustrated in FIG. 1. In other words, the left illustration of FIGS. 2, 3A, and 4A corresponds to the left illustration of FIG. 1, and the right illustration of FIGS. 2, 3A, and 4A corresponds to the right illustration of FIG. 1.

As illustrated in FIGS. 2, 3A, and 4A, the display device 1 includes the display panel substrate 20, printed circuit boards 23a to 23d and 24a to 24d, COF substrates 34a, COF substrates 34b, COF substrates 35a, and COF substrates 35b, the control unit 30, and the panel power supply unit 32. The control unit 30 includes a timing control unit (TCON)

95, a microcomputer 31, and a control signal generation unit 33. The control unit 30 is mounted on one of the printed circuit boards 23a to 23d and 24a to 24d or on another printed circuit board. The panel power supply unit 32 is mounted on another printed circuit board.

First, the correspondence between FIGS. 1, and 2, 3A, and 4A is described.

The gate driving circuit 12a in FIG. 1 is for the COF substrates 34a, the printed circuit board 23a, and the printed circuit board 23b which are disposed on the left side of the display panel substrate 20 in FIGS. 2, 3A, and 4A.

Figure 3B:
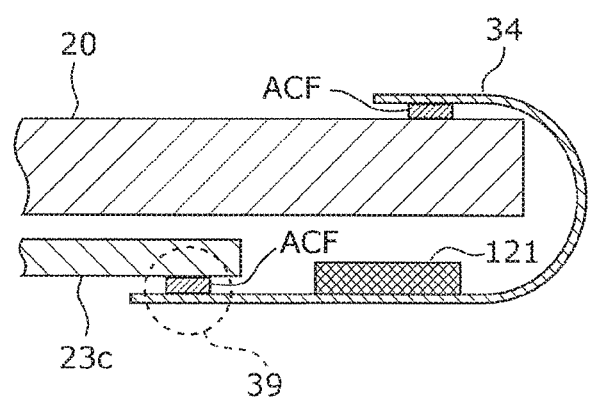
FIG. 3B is a cross-sectional view illustrating a cross section taken along line B-B in FIG. 3A.

The gate driving circuit 12b of FIG. 1 is for the COF substrates 34b, the printed circuit board 23c, and the printed circuit board 23d disposed on the right side of the display panel substrate 20 in FIGS. 2, 3A, and 3B.

The source driving circuit 14 in FIG. 1 is for the COF substrates 35a, the printed circuit board 24a, and the printed circuit board 24b which are disposed on the upper side of the display panel substrate 20 in FIGS. 2, 3A, and 3B.

Although FIG. 1 illustrates only one source driving circuit 14 which is on the upper side of the display panel substrate 20, FIGS. 2, 3A, and 4A illustrate the case where two source driving circuits 14 are disposed, one on the upper side of the display panel substrate 20, and the other on the lower side. The other source driving circuit (disposed on the lower side and not illustrated in FIG. 1) is for the COF substrates 35b, the printed circuit board 24c, and the printed circuit board 24d which are disposed on the lower side of the display panel substrate 20.

The following describes various substrates and the connections thereof. In the following description, if the positions of the COF substrates 34a and 34b are not to be particularly indicated, the COF substrates 34a and 34b are simply referred to as the COF substrates 34. The COF substrates 35a and 35b are also referred to as the COF substrates 35, as well. The printed circuit boards 23a to 23d and the printed circuit boards 24a to 24d are also referred to as the printed circuit boards 23 and the printed circuit boards 24, respectively.

The display panel substrate 20 includes the pixel circuits 16 disposed in rows and columns as illustrated in FIG. 1. The display panel substrate 20 is connected with the COF substrates 34a, 34b, 35a, and 35b at the peripheral portions of the display surface.

The COF substrates 34 are film substrates on which gate driver ICs 121 for display driving each including shift registers are mounted. The COF substrates 34 connect the display panel substrate 20 with the printed circuit boards 23.

This connection is described with reference to FIGS. 3B and 4B.

FIG. 3B is a cross-sectional view illustrating a cross section taken along B-B in FIG. 3A. As illustrated in FIG. 3B, the COF substrate 34 and the printed circuit board 23c are bonded by thermo-compression with an anisotropic conductive film (ACF) therebetween. Terminals (specifically, a pad of the display panel substrate 20 and a pad of the COF substrate 34) are electrically connected via the conductive particles in the ACF, and simultaneously terminals of respective substrate are insulated from one another. The COF substrate 34 and the printed circuit board 23c are connected by the adhesive being cured. A connected portion 39 in a circle indicated by the dashed line in FIG. 3B shows a connected portion in which the ACF connects one pad of the COF substrate 34 and one pad of the display panel substrate 20.

Similarly, the COF substrate 34 and the display panel substrate 20 are also connected by thermo-compression bonding with an ACF therebetween.

Figure 4B:
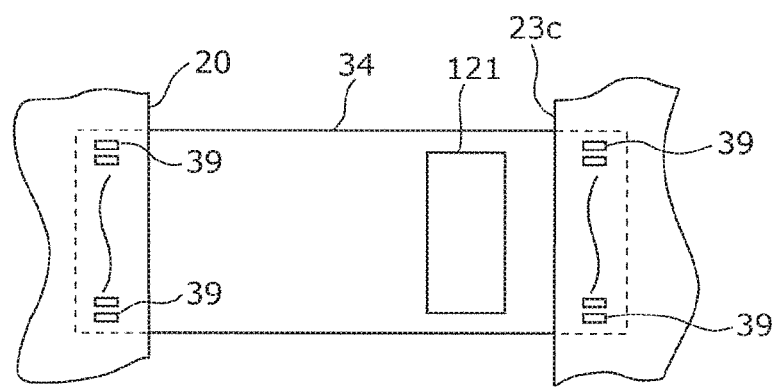
FIG. 4B is an enlarged view of portion A in FIG. 4A.

FIG. 4B is an enlarged view of portion A in FIG. 4A. As illustrated in FIG. 4B, the COF substrate 34 is a film substrate on which the gate driver IC 121 is mounted. Columns of pads are formed along sides of the COF substrate 34 having the gate driver IC 121 therebetween.

The pads in the column of the COF substrate 34 on the display panel substrate 20 side are connected with the gate signal output terminals of the gate driver IC 121 by lines. The pads in the column connected to the gate signal output terminals by lines are connected via the connected portions 39 to the ENB(i) signal line, the SCN(i) signal line, the REF(i) signal line, and the INI(i) signal line described above on the display panel substrate 20.

The pads in the column of the COF substrate 34 on the printed circuit board 23 side are connected by lines to, for instance, cascade input terminals and cascade output terminals for cascade connection and clock signal input terminals of the gate driver IC 121. The pads in the column are connected to the printed circuit board 23 via the connected portions 39. Here, cascading the gate driver ICs 121 means that shift registers in the gate driver IC 121 and shift registers in the gate driver IC 121 of the adjacent COF substrate 34 are connected in series.

[1-4. Connection of Driver ICs within COF Substrates 34]

Figure 5:
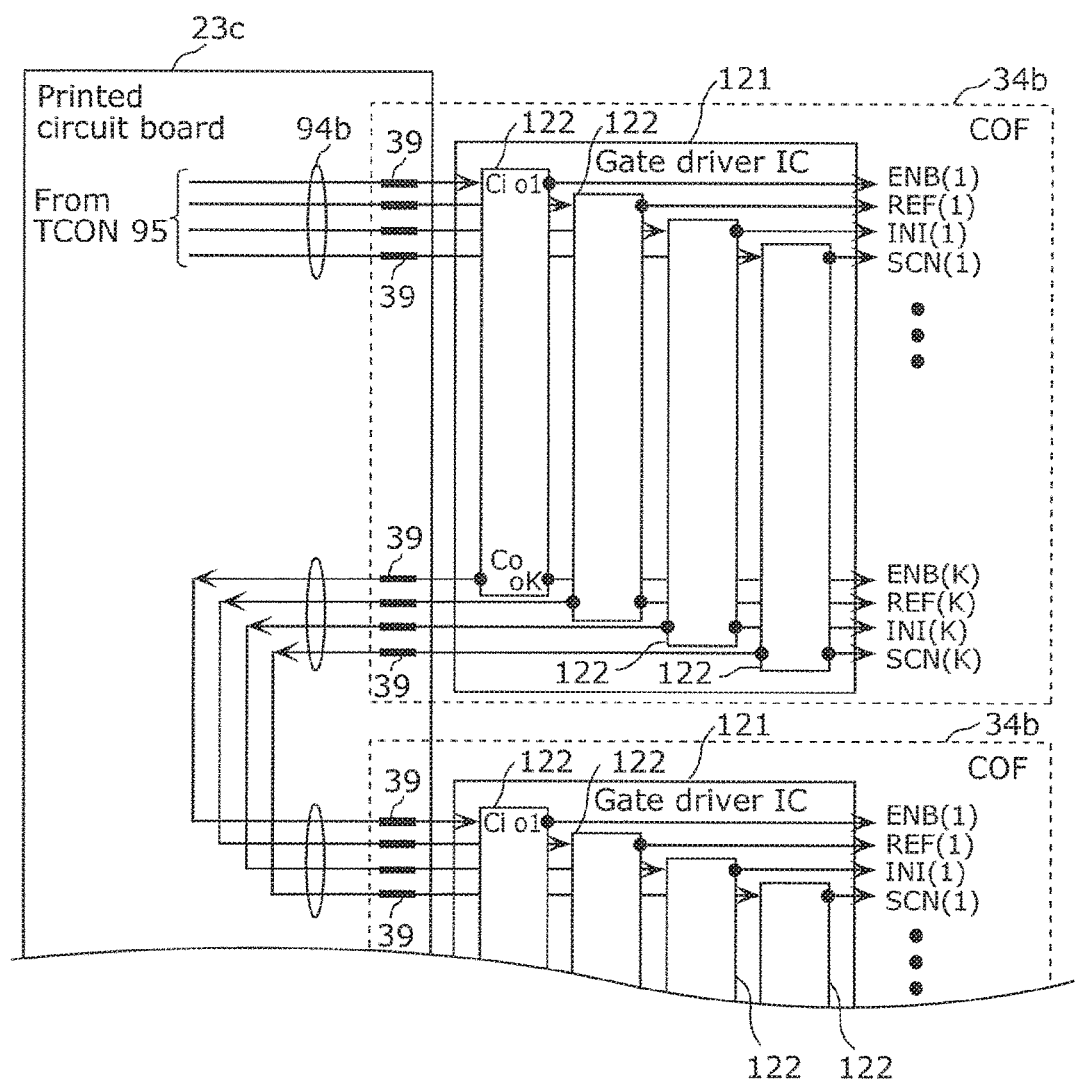
FIG. 5 is an enlarged view of portion C in FIG. 2.

A detailed description of connection of the gate driver ICs 121 is given with reference to FIG. 5. FIG. 5 is an enlarged view of portion C in FIG. 2.

In FIG. 5, gate signals output from the TCON 95 are four signals, namely, an enable signal, a REF control signal, a scan signal, and an INI control signal. Each gate driver IC 121 includes four shift registers 122 to scan and drive the four signals as gate signals to the display panel substrate 20. Each of the shift registers 122 in the stages include a shift register circuit which includes K flip-flops (FFs) connected in series, and an output buffer which increases driving capability of a signal output from the shift register circuit in the stage, and outputs the signal as a gate signal to the outside. Each of the shift registers 122 is a shift register in a K-th stage (for example, K is 180), and a cascade input terminal Ci, a cascade output terminal Co, and K gate signal output terminals o1 to oK, as illustrated in FIG. 5.

First, the cascade of the gate driver ICs 121 is described, with regard to the enable signal among the four gate signals from the gate driving circuit 12b.

In FIG. 5, an original signal of the enable signal is input from the TCON 95 to the cascade input terminal Ci of the leftmost shift register 122 via a gate signal line 94b (FIG. 2). The shift register 122 performs shift operation in synchronization with a clock signal. For example, the shift register 122 outputs the enable signal from a gate signal output terminal o1 corresponding to the FF in the first stage, in accordance with the first rising edge of the clock signal, and performs shift operation for each rising edge. The rows of the pixel circuits 16 of the display panel substrate 20 are scanned through this shift operation.

Furthermore, the enable signal is output from the gate signal output terminal oK corresponding to the FF in the K-th stage in accordance with the rising edge of the K-th clock pulse of the clock signal. The same signal as the signal from the gate signal output terminal oK is output from the cascade output terminal Co. The signal from the cascade output terminal Co is input to the cascade input terminal Ci of the leftmost shift register 122 of the adjacent COF substrate 34b disposed downstream of the cascade, via the connected portion 39, a line on the printed circuit board 23, and another connected portion 39.

As described above, the printed circuit board 23 includes lines for cascading the leftmost shift registers 122 in the gate driver ICs 121 of the COF substrates 34b. For example, when K is 180 and the number of display lines is 1080, six gate driver ICs 121 are cascaded. By cascading the six gate driver ICs 121, the leftmost shift registers 122 of the six gate driver ICs 121 are cascaded (here, the same as connected in series), and function as one long shift register. Accordingly, the leftmost shift registers 122 in the six gate driver ICs 121 scan an enable signal to the ENB(1) signal line to the ENB(n) signal line, via the gate signal output terminals (o1 to oK)×6.

Furthermore, a cascade output terminal of the gate driver IC 121 located most downstream of the cascade is connected to the TCON 95 via a return signal line 96b, as illustrated in FIG. 2. The TCON 95 can detect an abnormality of line connection such as detachment, by monitoring the return signal line 96b. Note that a return signal line 96a and the return signal line 96b may be each connected to a cascade output terminal of at least one gate driver IC located downstream of the gate driver IC located most upstream of the cascade.

The cascaded gate driver ICs 121 transmit the enable signal among four gate signals in the gate driving circuit 12b, as described above.

Although transmission of the enable signal through cascade has been described, the second leftmost shift register 122 of each of the six gate driver ICs 121 handles the REF control signal, and other than this, is the same as the leftmost shift register 122, as illustrated in FIG. 5. The third leftmost shift register 122 of each of the six gate driver ICs 121 handles the INI control signal, and other than this, is also the same as the leftmost shift register 122. The fourth leftmost shift register 122 of each of the six gate driver ICs 121 handles the scan signal, and other than this, is the same as the leftmost shift register 122.

The gate driving circuit 12a is the same as the gate driving circuit 12b. Specifically, the COF substrates (for example, six COF substrates) 34a are connected to the display panel substrate 20, and the gate driver IC 121 for display driving which includes shift registers is mounted on each of the COF substrates 34a. The printed circuit boards 23a and 23b are connected with the COF substrates 34a, and include lines for cascading the gate driver ICs 121. The control unit 30 supplies a gate signal via a gate signal line 94a to a cascade input terminal of the gate driver IC 121 located most upstream of the cascade, and monitors a signal from a cascade output terminal of the gate driver IC 121 located most downstream via the return signal line 96a.

The following describes the configuration of the control unit 30.

The TCON 95 in the control unit 30 supplies a predetermined signal (for example, a gate signal), via the gate signal line 94a, to a cascade input terminal of the gate driver IC 121 located most upstream of the cascade and mounted on one of the COF substrates 34a in the gate driving circuit 12a, and monitors, via the return signal line 96a, a signal from a cascade output terminal of the gate driver IC 121 located most downstream.

Similarly, the TCON 95 supplies a predetermined signal (for example, gate signal), via the gate signal line 94b, to a cascade input terminal of the gate driver IC 121 located most upstream of the cascade and mounted on one of the COF substrates 34b in the gate driving circuit 12b, and monitors a signal from a cascade output terminal of the gate driver IC 121 located most downstream via the return signal line 96b.

The microcomputer 31 receives the result of monitoring from the TCON 95, and if an abnormality is detected, the microcomputer 31, for instance, prohibits outputting a gate signal and stops power supply from the panel power supply unit 32 to the display panel substrate 20.

The control signal generation unit 33 generates various control signals for controlling units of the display device 1 (such as, for example, a tuner, a signal receiving unit which receives a signal from a remote control, and a sound signal output unit).

Note that the control unit 30 may not monitor a signal from a cascade output terminal of the gate driver IC 121 located most downstream. For example, the control unit 30 may monitor signals from cascade output terminals of all the cascaded gate driver ICs 121, or may monitor a signal from a cascade output terminal of the gate driver IC 121 at a substantially middle of the cascade. In other words, the control unit 30 may monitor a signal from a cascade output terminal of at least one gate driver IC located downstream of the gate driver IC located most upstream.

[2. Operation]

An example of operation by the display device having the configuration as described above to detect detachment of a COF substrate 34 will be described. The operation in this example is mainly performed by the TCON 95 and the microcomputer 31 in the control unit 30.

Figure 6A:
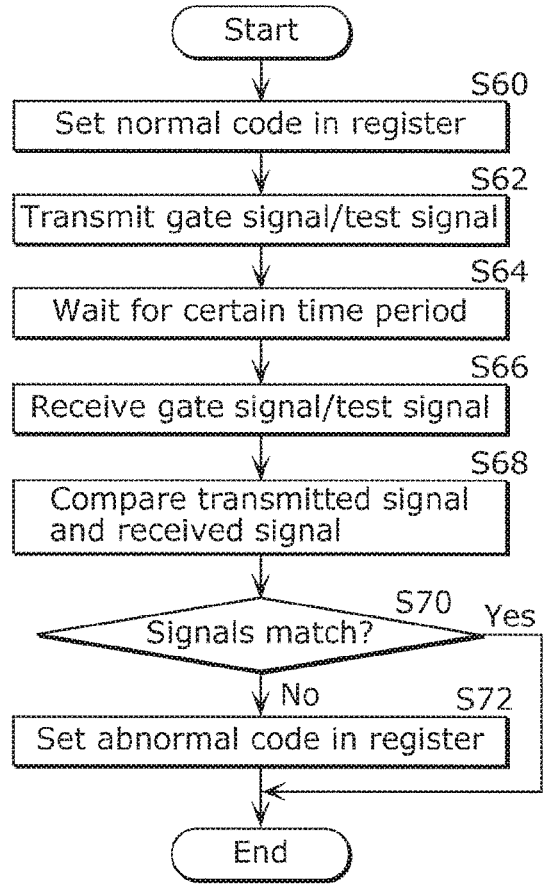
FIG. 6A is a flowchart illustrating operation of the control unit.

FIG. 6A is an example of a flowchart illustrating the above operation by the TCON 95 in the control unit 30.

First, the TCON 95 sets a normal code in a register in the TCON 95 (S60). This register may be one of the general registers in the TCON 95 or a dedicated register. Setting the normal code in the register may mean initialization of the register, and may be executed only once at the start-up of the display device 1, for example. If all the bits of the normal code are determined to be, for example, 0, the normal code can also be used to clear the register in the initializing operation.

Next, the TCON 95 simultaneously supplies a gate signal or a test signal to the gate signal lines 94a and 94b (S62). Simultaneously or prior to the supply of the gate signal or the test signal, the TCON 95 also supplies a clock signal for shift operation to the gate driving circuits 12a and 12b. The gate signals are four signals in the example in FIG. 5, namely, an enable signal, a REF control signal, an INI control signal, and a scan signal, and may also serve as gate signals which are output during the normal display operation. Furthermore, the TCON 95 may output a test signal having a specific signal pattern during a period in which normal display operation is not performed. For example, a period in which normal display operation is not performed may be, for example, when the display device 1 starts up, and a period in which video signals are switched in the display device 1 (for example, a period in which channels are switched, and a period in which sources of video input are switched). The pattern of a test signal may be the same as a pattern of a gate signal during normal display or a periodic signal pattern having a regular cycle such as a clock signal. A signal having a specific signal pattern is sufficient.

During a period from when a test signal is output to the cascade input terminal for an ENB signal line until when monitoring is completed, control for preventing unpredictable display on the display screen is preferably performed. For example, the panel power supply unit 32 may be controlled so as to temporarily stop the supply of the VTFT voltage.

Control for preventing unpredictable display on the display screen is preferably performed also during a period from when a test signal is output to a cascade input terminal for a signal line other than the ENB signal line until when monitoring is completed, and for example, the enable signal may be maintained inactive.

Next, the TCON 95 waits for a certain time period to elapse after the output of a gate signal or a test signal (S64). This certain time period is a time for the gate signal or the test signal to undergo the shift operation in the gate driving circuits 12a and 12b and appear in the return signal lines 96a and 96b, and specifically, corresponds to a period determined by (the number of all shift stages of the gate driving circuits 12)×(one cycle of a shift clock signal).

When a certain time period has elapsed, the TCON 95 receives signals from the return signal lines 96a and 96b (S66). Furthermore, the TCON 95 compares a signal pattern of the transmitted gate signal or test signal with a pattern of the received signal to determine whether the signal patterns match (S68). If the signal patterns match (S70: Yes), the TCON 95 determines that an abnormality has not occurred and ends processing, whereas if the signal patterns do not match (S70: No), the TCON 95 determines that an abnormality has occurred and sets an abnormal code in the above register (S72). The abnormal code may include 8 bits that includes, for example, 4 bits corresponding to four signals from return signal lines 96a and 4 bits corresponding to four signals from return signal lines 96b. The bits may each have a value of 0 if an abnormality has not occurred and a value of 1 if an abnormality has occurred. In this manner, such an abnormal code can indicate in which of the gate driving circuits 12a and 12b an abnormality has occurred, and which of the signals transmitted through the four signal lines indicates that an abnormality has occurred.

Accordingly, the TCON 95 detects an abnormality of line connection such as detachment of a COF substrate 34, and can further indicate the detected abnormality via the abnormal code.

The following describes processing performed by the microcomputer 31 in response to the above processing by the TCON 95.

Figure 6B:
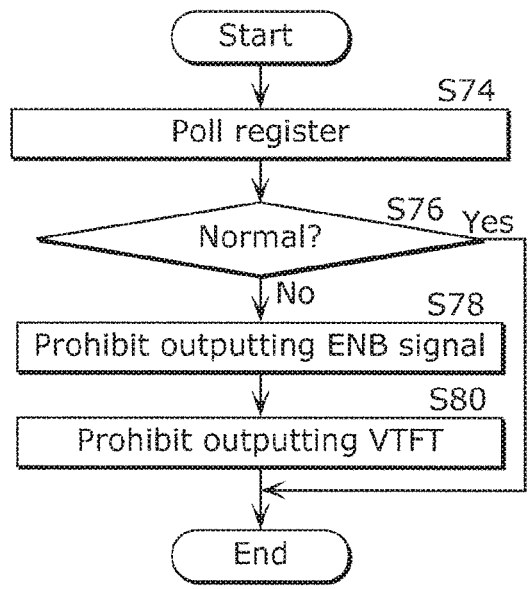
FIG. 6B is a flowchart illustrating operation of the control unit.

FIG. 6B is a flowchart illustrating an example of operation under the control of the microcomputer 31 included in the control unit 30. First, the microcomputer 31 polls the above register in the TCON 95 (S74). Specifically, the microcomputer 31 reads the above register periodically or when a predetermined event occurs. Furthermore, the microcomputer 31 determines whether the read data is normal (S76). The microcomputer 31 ends this processing if the determination result shows that the data is normal. The microcomputer 31 prohibits the enable signal from being output thereafter, if the determination result shows that the data is abnormal. In other words, the microcomputer 31 gives an instruction to the TCON 95 to fix the level of an enable signal for enabling/disabling light emission of the pixel circuits 16 row-by-row to the level indicating disabling the light emission (S78). Furthermore, the microcomputer 31 causes the panel power supply unit 32 to stop supplying power to power lines through which the voltage VTFT is supplied to the pixel circuits 16, by controlling the panel power supply unit 32 (S80).

In this manner, when an abnormality of line connection such as detachment occur, the control unit 30 can prevent abnormal display of, abnormal heat generation by, and damage to the display device due to a gate signal not being supplied appropriately.

Note that the microcomputer 31 may perform following (1) through (5), instead of steps S78 and S80 above.

(1) If the gate signal determined to be abnormal is an enable signal for enabling/disabling light emission of the pixel circuits 16 row-by-row, the microcomputer 31 gives an instruction to the TCON 95 so as to fix the level of the enable signal to the level indicating disabling light emission.

(2) If the gate signal determined to be abnormal is a write signal (in other words, scan signal) for selecting the pixel circuits 16 row-by-row, and writing a voltage representing brightness to the pixel circuits 16 belonging to the selected row, the microcomputer 31 causes the panel power supply unit 32 to stop supplying power to power lines through which power is supplied to the pixel circuits 16, by controlling the panel power supply unit 32.

(3) If the gate signal determined to be abnormal is a write signal (in other words, scan signal) for selecting the pixel circuits 16 row-by-row, and writing a voltage representing brightness to the pixel circuits 16 belonging to the selected row, the microcomputer 31 fixes the level of an enable signal for enabling/disabling light emission of the pixel circuits 16 row-by-row to the level indicating disabling light emission.

If the gate signal determined to be abnormal is one of an enable signal for enabling/disabling light emission of the pixel circuits 16 row-by-row, a write signal (in other words, scan signal) for selecting the pixel circuits 16 row-by-row and writing a voltage representing brightness to the pixel circuits 16 belonging to the selected row, a reference voltage setting signal (in other words, REF control signal) for applying a reference voltage to the pixel circuits 16 row-by-row, and an initial voltage setting signal (in other words, INI control signal) for applying an initial voltage to the pixel circuits row-by-row, the microcomputer 31 fixes the level of the enable signal to the level indicating disabling light emission, or causes the panel power supply unit 32 to stop supplying power to the power lines through which the voltage VTFT is supplied to the pixel circuits 16, by controlling the panel power supply unit 32.

If the gate signal determined to be abnormal is one of an enable signal, a write signal (in other words, scan signal), a REF control signal, and an INI control signal, the microcomputer 31 fixes the level of each of the enable signal, the write signal (in other words, scan signal), the REF control signal, and the INI control signal to the level indicating disabling, and furthermore causes the panel power supply unit 32 to stop supplying power to the power lines for supplying the voltages VTFT, VREF, VINI, and VEL to the pixel circuits 16, by controlling the panel power supply unit 32.

[3. Operation and Advantageous Effect]

The display device according to the present embodiment can detect an abnormality of line connection such as detachment of a COF substrate 34 from a printed circuit board 23, and indicate details of the detected abnormality via the abnormal code. Furthermore, when an abnormality of line connection such as detachment occurs, the display device can prevent, for instance, abnormal display, abnormal heat generation, and damage, due to a gate signal not being supplied appropriately.

Note that Embodiment 1 has described an example in which the return signal line 96b is connected to a cascade output terminal of the gate driver IC 121 disposed most downstream of the cascade, but the present embodiment is not limited to this example. In other words, the return signal line 96b may connect the TCON 95 and a cascade output terminal of at least one gate driver IC 121 among the cascaded gate driver ICs 121. For example, return signal lines 96b may connect the TCON 95 and cascade output terminals of all the gate driver ICs 121 from the gate driver IC 121 disposed most upstream to the gate driver IC 121 disposed most downstream. Furthermore, return signal lines 96b may connect the TCON 95 and cascade output terminals of at least two gate driver ICs 121 selected from among the cascaded gate driver ICs 121.

By including a plural number of return signal lines 96b, the microcomputer 31 can detect in more detail, among the cascaded gate driver ICs 121, up to which gate driver IC 121 is normal, and from which gate driver IC 121 is abnormal. In this manner, for example, if the microcomputer 31 detects only one gate driver IC 121 disposed most upstream is normal, and the other gate driver ICs 121 disposed downstream of the gate driver IC 121 are abnormal, microcomputer 31 can display a message for informing a user of the abnormality, on K pixel circuit rows corresponding to the one gate driver IC 121 disposed most upstream.

The present embodiment has also described an example in which the return signal line 96a is connected to a cascade output terminal of the gate driver IC 121 disposed most downstream of the cascade, but is not limited to such an example. The same as the case of the return signal lines 96b also applies to return signal lines 96a.

In FIG. 6A, the TCON 95 may generate an interrupt signal for the microcomputer 31 in S72. This allows the microcomputer 31 to skip S74 and S76, and to execute S78 and S80 as interrupt processing.

Embodiment 2

The following describes a display device according to Embodiment 2.

Figure 7:
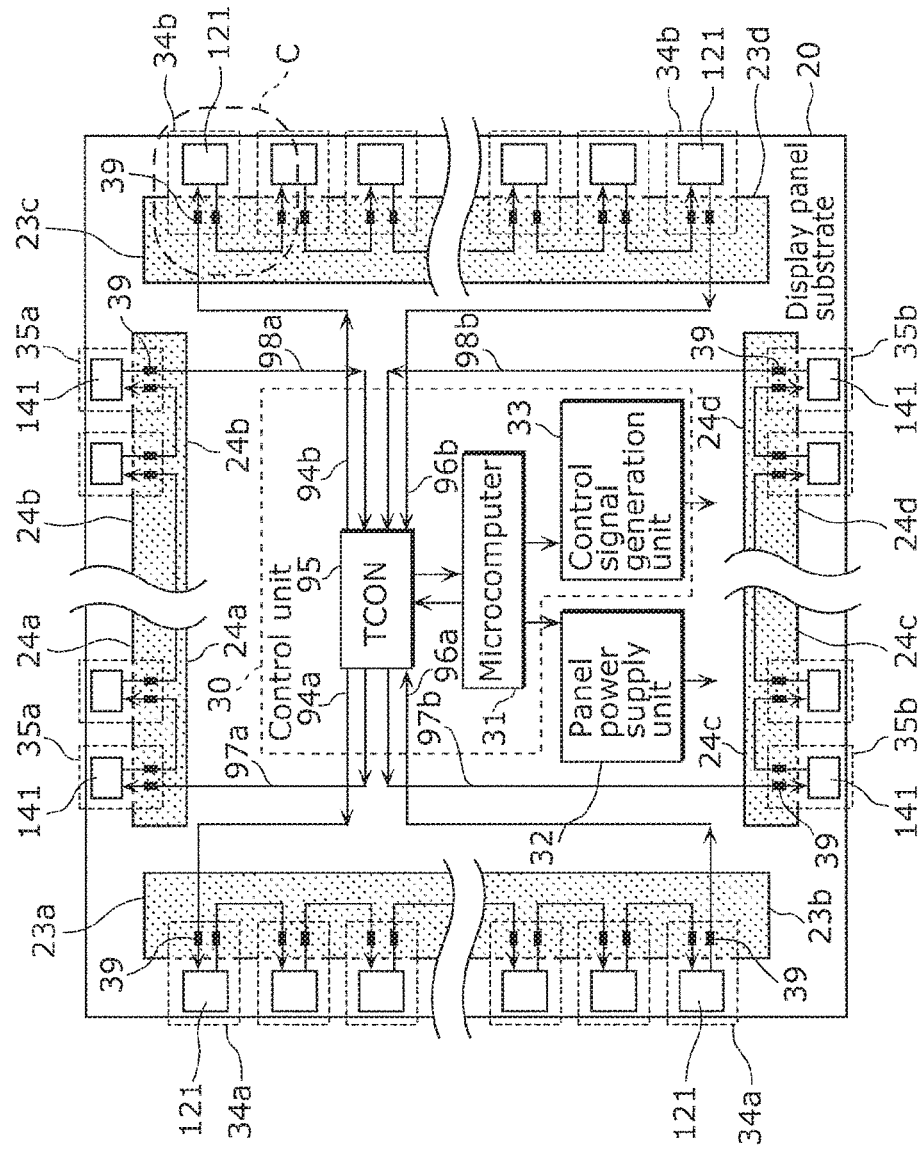
FIG. 7 illustrates an example of a configuration of various substrates and lines of a display device according to Embodiment 2.

FIG. 7 illustrates an example of a configuration of various substrates and lines of the display device according to the present embodiment. FIG. 7 differs from FIG. 2 in that data signal lines 97a and 97b and return signal lines 98a and 98b are added. A description is given below focusing on differences.

The data signal lines 97a and 97b are omitted from the illustration in FIG. 2, and are signal lines for supplying, from a TCON 95 to a source driving circuit 14, pixel data which is included in a video signal from a tuner in the display device or from the outside, and is to be supplied to pixel circuits. The data signal line 97a is connected to a cascade input terminal of a COF substrate 35a located at the leading end of a display column, and thus is cascaded to source driver ICs 141 within the COF substrates 35a. In other words, cascade output terminals of the source drivers IC 141 within the COF substrates 35a are each connected, via a printed circuit board 24, to a cascade input terminal of the source driver IC 141 within the adjacent COF substrate 35a disposed downstream.

Each of the source drivers IC 141 includes, for example, shift registers, a latch circuit which latches pixel data output parallel from the shift registers, m digital-to-analog converters (m is the number of columns of pixel circuits) which convert the pixel data in the latch circuit into analog values, and an output buffer which outputs the analog values output from the digital-to-analog converter to a D(1) signal line to a D(m) signal line.

The source driver ICs 141 located on the upper side of a display panel substrate 20 are cascaded, thus connecting the shift registers in the source driver ICs 141 in series to form one long shift register of m stages.

The return signal line 98a is connected to the TCON 95 via a cascade output terminal of the source driver IC 141 within the COF substrate 35a located most downstream of the cascade, and the source driver IC 141 feeds back pixel data to the TCON 95 through the return signal line 98a.

The TCON 95 detects an abnormality of line connection such as detachment of the COF substrate 35a, by monitoring a signal from the return signal line 98a. The detected abnormality is written in a register as an abnormal code which indicates the connection abnormality of the COF substrate 35a. This register may be the same as the register described with reference to FIG. 6A, or may be another register.

A microcomputer 31 polls the register, and if the abnormal code is set in the register, the microcomputer 31 fixes the level of the enable signal to a level indicating disabling light emission, or causes a power supply unit to stop supplying power to power lines for supplying power to pixel circuits 16, by controlling the power supply unit.

The above has described the return signal line 98a in FIG. 7, and the same also applies to the return signal line 98b in FIG. 7. Specifically, the same also applies to COF substrates 35b on the lower side of the display panel substrate 20.

As described above, the display device according to Embodiment 2 not only detects a connection abnormality such as detachment of a COF substrate 34 on which the source driver IC 141 is mounted, but also detects a connection abnormality such as detachment of a COF substrate 35 on which the source driver IC 141 is mounted. Furthermore, when the abnormality of line connection such as detachment occurs, the display device can prevent, for instance, abnormal display, abnormal heat generation, and damage due to a gate signal or a data signal not being supplied appropriately.

Note that Embodiment 2 has described an example in which the return signal line 98a is connected to a cascade output terminal of the source driver IC 141 disposed most downstream of the cascade, but is not limited to such an example. In other words, the return signal line 98a may connect the TCON 95 and a cascade output terminal of at least one of the cascaded source driver ICs 141. For example, return signal lines 98a may connect the TCON 95 and cascade output terminals of all the source driver ICs 141 from the source driver IC 141 disposed most upstream to the source driver IC 141 disposed most downstream. Furthermore, return signal lines 98a may connect the TCON 95 and cascade output terminals of at least two source driver ICs 141 selected from among the cascaded source driver ICs 141.

By including a plural number of return signal lines 98a, the microcomputer 31 can detect in more detail, among the cascaded source driver ICs 141, up to which source driver IC 141 is normal, and from which source driver IC 141 is abnormal. In this manner, for example, if the microcomputer 31 can detect only one source driver IC 141 disposed most upstream is normal, and the other source driver ICs 141 disposed downstream of the source driver IC 141 are abnormal, the microcomputer 31 can display a message for informing a user of the abnormality, on K pixel circuit rows corresponding to the one source driver IC 141 disposed most upstream.

The present embodiment has described an example in which the return signal line 98b is also connected to a cascade output terminal of the source driver IC 141 disposed most downstream of the cascade, but is not limited to such an example. The same as the case of the return signal lines 98a also applies to return signal lines 98b.

Note that although in the embodiments, the TCON 95 determines whether a line abnormality such as detachment has occurred, by comparing signals from return signal lines 96a and 96b and the return signal lines 98a and 98b with the original signals output by the TCON 95 to gate signal lines 94a and 94b and the data signal lines 97a and 97b, the embodiments are not limited to this. For example, the TCON 95 may determine whether or not a line abnormality has occurred, based on whether signals from the return signal lines 96a, 96b, 98a, and 98b have changed. For example, the TCON 95 may determine that a line abnormality has not occurred if the levels of signals from the return signal lines 96a, 96b, 98a, and 98b have changed over a period of one or more frames during normal display, and if the levels have not changed, may determine that a line abnormality has occurred.

Signals from the return signal lines 96a and 96b are not limited to the above gate signals, and may be signals transmitted by cascaded gate driver ICs 121. For example, the signals may be clock signals for shift operation supplied to the gate driver ICs 121.

The signals from the return signal lines 98a and 98b are not limited to the above data signals, and may be signals transmitted by cascaded source driver ICs 141. For example, the signals may be clock signals for shift operations supplied to the source driver ICs 141.

As described above, a display device according to an aspect of the present disclosure includes: a display panel substrate which includes a plurality of pixel circuits disposed in rows and columns; a plurality of film substrates connected to the display panel substrate; a plurality of driver integrated circuits (ICs) for display driving, which are mounted on the display panel substrate or on the plurality of film substrates, and each of which includes a shift register; a printed circuit board connected to the plurality of film substrates, and including one or more lines which cascade the plurality of driver ICs; and a control unit configured to supply a predetermined signal to a cascade input terminal of a driver IC located most upstream among the plurality of driver ICs cascaded, and monitor a signal from a cascade output terminal of at least one driver IC located downstream of the driver IC located most upstream. Here, the plurality of driver ICs are the gate driver ICs 121 or the source driver ICs 141, for example. The plurality of film substrates are the COF substrates 34a and 34b or the COF substrates 35a and 35b, for example.

According to this configuration, a connection abnormality such as detachment of a film substrate can be detected.

Here, the control unit may be configured to compare the predetermined signal and the signal from the cascade output terminal, and determine that an abnormality has occurred, if the predetermined signal and the signal differ from each other.

According to this configuration, it can be determined whether line connection is normal or abnormal.

Here, the predetermined signal may be an enable signal for enabling and disabling light emission of the plurality of pixel circuits row-by-row, and if the control unit determines that an abnormality has occurred, the control unit may be configured to cause a power supply unit to stop supplying power to a power line for supplying power to the plurality of pixel circuits, by controlling the power supply unit.

According to this configuration, if the enable signal transmitted through the cascade indicates that an abnormality has occurred, the supply of a current to the plurality of pixel circuits is stopped, and thus abnormal heat generation and damage, for instance, due to a line abnormality can be prevented.

Here, the predetermined signal may be an enable signal for enabling and disabling light emission of the plurality of pixel circuits row-by-row, and if the control unit determines that an abnormality has occurred, the control unit may be configured to fix a level of the enable signal to a level indicating disabling the light emission.

According to this configuration, if the enable signal transmitted through the cascade indicates that an abnormality has occurred, the supply of a current to the plurality of pixel circuits is stopped, and thus abnormal display due to a line abnormality can be prevented.

Here, the predetermined signal may be a write signal for selecting the plurality of pixel circuits row-by-row, and writing a voltage representing brightness to pixel circuits belonging to a selected row, and if the control unit determines that an abnormality has occurred, the control unit may be configured to cause a power supply unit to stop supplying power to a power line for supplying power to the plurality of pixel circuits, by controlling the power supply unit.

According to this configuration, if the write signal (in other words, scan signal) transmitted through the cascade indicates that an abnormality has occurred, the supply of a current to the plurality of pixel circuits is stopped, and thus abnormal heat generation and damage, for instance, due to line abnormality can be prevented.

Here, the predetermined signal may be a write signal for selecting the plurality of pixel circuits row-by-row, and writing a voltage representing brightness to pixel circuits belonging to a selected row, and if the control unit determines that an abnormality has occurred, the control unit may be configured to fix a level of an enable signal for enabling and disabling light emission of the plurality of pixel circuits row-by-row to a level indicating disabling the light emission.

According to this configuration, if the write signal (in other words, scan signal) transmitted through the cascade indicates that an abnormality has occurred, the supply of a current to the plurality of pixel circuits is stopped, and thus abnormal display due to a line abnormality can be prevented.

Here, the predetermined signal may include: an enable signal for enabling and disabling light emission of the plurality of pixel circuits row-by-row; a write signal for selecting the plurality of pixel circuits row-by-row, and writing a voltage representing brightness to pixel circuits belonging to a selected row; a reference voltage setting signal for applying a reference voltage to the plurality of pixel circuits row-by-row; and an initial voltage setting signal for applying an initial voltage to the plurality of pixel circuits row-by-row, and if the control unit determines that at least one of the enable signal, the write signal, the reference voltage setting signal, and the initial voltage setting signal indicates that an abnormality has occurred, the control unit may be configured to fix a level of the enable signal to a level indicating disabling the light emission, or cause a power supply unit to stop supplying power to a power line for supplying power to the plurality of pixel circuits, by controlling the power supply unit.

According to this configuration, if one of the gate signals transmitted through the cascade indicates that an abnormality has occurred, abnormal display, abnormal heat generation, and damage, for instance, due to a line abnormality can be prevented.

Here, the predetermined signal may represent pixel data to be supplied to one of the plurality of pixel circuits, and if the control unit determines that an abnormality has occurred, the control unit may be configured to fix a level of an enable signal for enabling and disabling light emission of the plurality of pixel circuits row-by-row to a level indicating disabling the light emission, or cause a power supply unit to stop supplying power to a power line for supplying power to the plurality of pixel circuits, by controlling the power supply unit.

According to this configuration, if the signal indicating pixel data transmitted through the cascade indicates that an abnormality has occurred, the supply of a current to a plurality of pixel circuits is stopped. Thus, abnormal display, abnormal heat generation, and damage, for instance, due to a line abnormality can be prevented.

Here, film substrates among the plurality of film substrates may be connected to a front side of the display panel substrate along one side, and other film substrates among the plurality of film substrates are connected to the front side along another side opposite the one side, the one or more lines of the printed circuit board may include a line which cascades, among the plurality of driver ICs, driver ICs mounted on the film substrates along the one side, and a line which cascades, among the plurality of driver ICs, driver ICs mounted on the film substrates along the other side, and the control unit may be configured to supply the predetermined signal to a cascade input terminal of a driver IC located most upstream among the driver ICs along the one side, and simultaneously supply the predetermined signal, which is identical to the predetermined signal supplied to the cascade input terminal, to a cascade input terminal of a driver IC located most upstream among the driver ICs along the other side, and monitor a signal from a cascade output terminal of at least one driver IC located downstream of the driver IC located most upstream along the one side, and a signal from a cascade output terminal of at least one driver IC located downstream of the driver IC located most upstream along the other side.

According to this configuration, a connection abnormality, such as detachment of a film substrate can be detected at both of the one side and the other side of the display panel substrate.

Furthermore, a method for driving a display device according to an aspect of the present disclosure is a method for driving a display device which includes: a display panel substrate which includes a plurality of pixel circuits disposed in rows and columns; a plurality of film substrates connected to the display panel substrate; a plurality of driver integrated circuits (ICs) for display driving, which are mounted on the display panel substrate or on the plurality of film substrates, and each of which includes a shift register; and a printed circuit board connected to the plurality of film substrates, and including one or more lines which cascade the plurality of driver ICs, the method including: supplying a predetermined signal to a cascade input terminal of a driver IC located most upstream among the plurality of driver ICs cascaded; and monitoring a signal from a cascade output terminal of at least one driver IC located downstream of the driver IC located most upstream.

According to this configuration, a connection abnormality such as detachment of a film substrate can be detected.

The above has described a display device and a method for driving the display device based on embodiments, yet the present disclosure is not limited to such embodiments. The technology according to the present disclosure is not limited to the embodiments, and also applicable to embodiments to which change, replacement, addition, and omission, for instance, has been appropriately made. Modifications obtained by applying various changes conceivable by a person skilled in the art to the embodiments and modifications which include any combinations of the elements in different embodiments are also included in one or more aspects without departing from the scope of the present disclosure.

The display device described above may adopt not only a configuration in which a film substrate which includes a film on which a driver IC is mounted is used (COF configuration), but also a configuration in which a driver IC is mounted on a display panel substrate, but not on a film substrate (chip on glass (COG) configuration).

Figure 8:
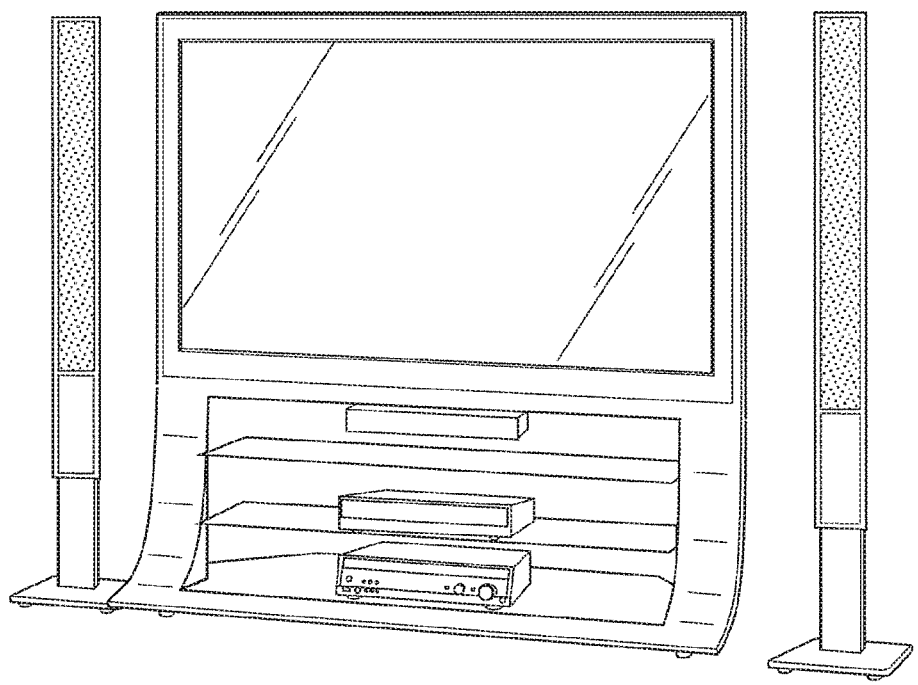
FIG. 8 illustrates an example of a product of the display device.

The display device described above may be used as, for example, a flat panel display device as illustrated in FIG. 8. Furthermore, the display device may be applicable to any electronic devices each having a display device, such as televisions, personal computers, and mobile phones.

Note that the display device described above may be not only an organic EL display device, but also a flat panel display device such as a liquid crystal display or a plasma display panel (PDP) display device, for example.

INDUSTRIAL APPLICABILITY

The present disclosure is applicable to display devices such as televisions and displays of information devices.

The invention claimed is:
1. A display device, comprising:
a display panel substrate which includes a plurality of pixel circuits disposed in rows and columns;
a plurality of film substrates connected to the display panel substrate;
a plurality of driver integrated circuits (ICs) for display driving, each of the plurality of driver ICs being mounted on the display panel substrate or on the plurality of film substrates, and including a shift register;
a printed circuit board connected to the plurality of film substrates, and including one or more lines which cascade the plurality of driver ICs; and
a controller configured to supply a predetermined signal to a cascade input terminal of a driver IC located most upstream among the plurality of driver ICs cascaded, and monitor a signal from a cascade output terminal of at least one driver IC located downstream of the driver IC located most upstream, wherein
the controller is configured to compare the predetermined signal and the signal from the cascade output terminal, and determine that an abnormality has occurred when the predetermined signal and the signal differ,
the predetermined signal is an enable signal for enabling and disabling light emission of the plurality of pixel circuits row-by-row, and
when the controller determines that the abnormality has occurred, the controller is configured to cause a power supply to stop supplying power to a power line for supplying power to the plurality of pixel circuits, by controlling the power supply.
2. A display device, comprising:
a display panel substrate which includes a plurality of pixel circuits disposed in rows and columns;
a plurality of film substrates connected to the display panel substrate;
a plurality of driver integrated circuits (ICs) for display driving, each of the plurality of driver ICs being mounted on the display panel substrate or on the plurality of film substrates, and including a shift register;

a printed circuit board connected to the plurality of film substrates, and including one or more lines which cascade the plurality of driver ICs; and a controller configured to supply a predetermined signal to a cascade input terminal of a driver IC located most upstream among the plurality of driver ICs cascaded, and monitor a signal from a cascade output terminal of at least one driver IC located downstream of the driver IC located most upstream, wherein the controller is configured to compare the predetermined signal and the signal from the cascade output terminal, and determine that an abnormality has occurred when the predetermined signal and the signal differ, the predetermined signal is an enable signal for enabling and disabling light emission of the plurality of pixel circuits row-by-row, and when the controller determines that the abnormality has occurred, the controller is configured to fix a level of the enable signal to a level indicating disabling the light emission.

3. A display device, comprising:

a display panel substrate which includes a plurality of pixel circuits disposed in rows and columns;

a plurality of film substrates connected to the display panel substrate;

a plurality of driver integrated circuits (ICs) for display driving, each of the plurality of driver ICs being mounted on the display panel substrate or on the plurality of film substrates, and including a shift register;

a printed circuit board connected to the plurality of film substrates, and including one or more lines which cascade the plurality of driver ICs; and a controller configured to supply a predetermined signal to a cascade input terminal of a driver IC located most upstream among the plurality of driver ICs cascaded, and monitor a signal from a cascade output terminal of at least one driver IC located downstream of the driver IC located most upstream, wherein the controller is configured to compare the predetermined signal and the signal from the cascade output terminal, and determine that an abnormality has occurred when the predetermined signal and the signal differ, the predetermined signal is a write signal for selecting the plurality of pixel circuits row-by-row, and writing a voltage representing brightness to pixel circuits belonging to a selected row, and when the controller determines that the abnormality has occurred, the controller is configured to cause a power supply to stop supplying power to a power line for supplying power to the plurality of pixel circuits, by controlling the power supply.

4. A display device, comprising:

a display panel substrate which includes a plurality of pixel circuits disposed in rows and columns;

a plurality of film substrates connected to the display panel substrate;

a plurality of driver integrated circuits (ICs) for display driving, each of the plurality of driver ICs being mounted on the display panel substrate or on the plurality of film substrates, and including a shift register;

a printed circuit board connected to the plurality of film substrates, and including one or more lines which cascade the plurality of driver ICs; and a controller configured to supply a predetermined signal to a cascade input terminal of a driver IC located most upstream among the plurality of driver ICs cascaded, and monitor a signal from a cascade output terminal of at least one driver IC located downstream of the driver IC located most upstream, wherein the controller is configured to compare the predetermined signal and the signal from the cascade output terminal, and determine that an abnormality has occurred when the predetermined signal and the signal differ, the predetermined signal is a write signal for selecting the plurality of pixel circuits row-by-row, and writing a voltage representing brightness to pixel circuits belonging to a selected row, and when the controller determines that the abnormality has occurred, the controller is configured to fix a level of an enable signal for enabling and disabling light emission of the plurality of pixel circuits row-by-row to a level indicating disabling the light emission.

5. A display device, comprising:

a display panel substrate which includes a plurality of pixel circuits disposed in rows and columns;

a plurality of film substrates connected to the display panel substrate;

a plurality of driver integrated circuits (ICs) for display driving, each of the plurality of driver ICs being mounted on the display panel substrate or on the plurality of film substrates, and including a shift register;

a printed circuit board connected to the plurality of film substrates, and including one or more lines which cascade the plurality of driver ICs; and a controller configured to supply a predetermined signal to a cascade input terminal of a driver IC located most upstream among the plurality of driver ICs cascaded, and monitor a signal from a cascade output terminal of at least one driver IC located downstream of the driver IC located most upstream, wherein the controller is configured to compare the predetermined signal and the signal from the cascade output terminal, and determine that an abnormality has occurred when the predetermined signal and the signal differ, the predetermined signal includes: an enable signal for enabling and disabling light emission of the plurality of pixel circuits row-by-row; a write signal for selecting the plurality of pixel circuits row-by-row, and writing a voltage representing brightness to pixel circuits belonging to a selected row; a reference voltage setting signal for applying a reference voltage to the plurality of pixel circuits row-by-row; and an initial voltage setting signal for applying an initial voltage to the plurality of pixel circuits row-by-row, and when the controller determines that at least one of the enable signal, the write signal, the reference voltage setting signal, and the initial voltage setting signal indicates that the abnormality has occurred, the controller is configured to fix a level of the enable signal to a level indicating disabling the light emission, or cause a power supply to stop supplying power to a power line for supplying power to the plurality of pixel circuits, by controlling the power supply.

6. The A display device, comprising:

a display panel substrate which includes a plurality of pixel circuits disposed in rows and columns;

a plurality of film substrates connected to the display panel substrate;

a plurality of driver integrated circuits (ICs) for display driving, each of the plurality of driver ICs being mounted on the display panel substrate or on the plurality of film substrates, and including a shift register;
a printed circuit board connected to the plurality of film substrates, and including one or more lines which cascade the plurality of driver ICs; and
a controller configured to supply a predetermined signal to a cascade input terminal of a driver IC located most upstream among the plurality of driver ICs cascaded, and monitor a signal from a cascade output terminal of at least one driver IC located downstream of the driver IC located most upstream, wherein
the controller is configured to compare the predetermined signal and the signal from the cascade output terminal, and determine that an abnormality has occurred when the predetermined signal and the signal differ,
the predetermined signal represents pixel data to be supplied to one of the plurality of pixel circuits, and
when the controller determines that the abnormality has occurred, the controller is configured to fix a level of an enable signal for enabling and disabling light emission of the plurality of pixel circuits row-by-row to a level indicating disabling the light emission, or cause a power supply to stop supplying power to a power line for supplying power to the plurality of pixel circuits, by controlling the power supply.

* * * * *